(12) United States Patent
Hara

(10) Patent No.: US 6,222,900 B1
(45) Date of Patent: Apr. 24, 2001

(54) COUNTER DEVICE

(75) Inventor: Tetsuya Hara, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/436,244

(22) Filed: Nov. 9, 1999

(30) Foreign Application Priority Data

Jun. 11, 1999 (JP) .................................................. 11-165821

(51) Int. Cl.[7] .................................................. H03K 21/38
(52) U.S. Cl. .................. 377/107; 377/27; 377/44
(58) Field of Search .................. 377/44, 107, 27

(56) References Cited

U.S. PATENT DOCUMENTS 4,631,484 * 12/1986 Malka et al. .......................... 328/63

FOREIGN PATENT DOCUMENTS 7-134187    5/1995    (JP) .

* cited by examiner

*Primary Examiner*—Margaret R. Wambach
(74) *Attorney, Agent, or Firm*—Burns, Doane, Swecker & Mathis, LLP

(57) ABSTRACT

There is provided a counter device comprising a master counter for counting an input signal applied thereto and a plurality of local counters disposed in a plurality of functional blocks, respectively, each for counting the input signal applied thereto, and for holding a count value corresponding to a plurality of bits of a count value of the master counter. A bus is disposed for each of the plurality of functional blocks to refer to remaining bits of the count value of the master counter.

11 Claims, 6 Drawing Sheets

COUNTER DEVICE

BACKGROUND OF THE INVENTION

1. Field of the Invention

The present invention relates to a counter device comprising a master counter and a plurality of functional blocks each including a local counter.

2. Description of the Prior Art

An increase in the packing density of LSIs increases power consumption in wiring, thus exerting a large influence upon the power consumption in the whole of one chip. In one-chip devices, such as system LSIs, including a plurality of functional blocks, the length of wiring for connecting them with each other increases with increases in the number of the plurality of functional blocks. It is thus important to reduce power consumption in wiring through which a signal to be referred in common by the plurality of functional blocks is passed.

System LSIs have a plurality of blocks formed in units of functionality and a common time to cause the plurality of functional blocks to operation in cooperation with one another. For example, in a system which conforms to the Read-only DVD Standard, a plurality of decoders (for Video Sub-picture, PCI, Audio) can refer to System Time Clock or STC. The STC is a timer whose value periodically varies.

When each of a plurality of blocks refers to STC within one chip device in which a master counter is provided for enabling each of the plurality of blocks to refer to the STC, as shown in FIG. 5, that is, each of the plurality of blocks refers to the contents of the master counter, a bus connecting the master counter with the plurality of blocks frequently changes in voltage, thus increasing the power consumption in the bus.

Referring now to FIG. 6, there is illustrated a block diagram of another prior art counter device in which a plurality of functional blocks include respective counters that can be brought into synchronization with each other by a common control signal (or reset signal). The prior art counter device can reduce the power consumption because it does not include a bus for connecting a master counter with the plurality of functional blocks. However, since each of the plurality of functional blocks needs its own counter, the amount of hardware is increased.

A problem with a prior art counter device as shown in FIG. 5 is that each of a plurality of functional blocks needs to refer to a master counter, such as a timer counter, whose count value periodically, frequently changes, and therefore a bus for connecting the master counter with the plurality of blocks frequently changes in voltage or value, thus increasing the power consumption. Further, a problem with another prior art counter device, as shown in FIG. 6, in which a plurality of functional blocks include respective counters, is that although the power consumption can be reduced because no bus is needed for connecting a master counter with the plurality of functional blocks, the amount of hardware is increased.

SUMMARY OF THE INVENTION

The present invention is made to overcome the above problems. It is therefore an object of the present invention to provide a counter device capable of reducing the number of times that a bus for connecting a master counter with a plurality of functional blocks changes in voltage, thus decreasing the power consumption in the bus.

In accordance with one aspect of the present invention, there is provided a counter device comprising: a master counter for counting an input signal applied thereto; a plurality of local counters disposed in a plurality of functional blocks, respectively, each for counting the input signal applied thereto, and for holding a count value corresponding to a plurality of bits of a count value of the master counter; and a bus used for each of the plurality of functional blocks to refer to remaining bits of the count value of the master counter. The counter device can thus reduce the number of times that the bus changes in voltage or value, thus reducing the power consumption in the bus. In addition, since each of the plurality of functional blocks only has the local counter with a plurality of bits only required for holding the binary value of the specified bits of the count value of the master counter, thus reducing the amount of hardware.

Preferably, the plurality of bits of the count value of the master counter are a plurality of lower-order bits of the count value of the master counter.

The input signal can be a clock. As an alternative, the input signal is a counter control signal supplied from outside the counter device or generated by another functional block built in one chip including the counter device, the counter control signal being generated based on a sequence of events.

In accordance with another aspect of the present invention, there is provided a counter device comprising: a master counter for counting an input signal applied thereto; a plurality of local counters disposed in a plurality of functional blocks, respectively, each for counting the input signal applied thereto, and for holding a count value corresponding to a plurality of bits of a count value of the master counter; a bus used for each of the plurality of functional blocks to refer to remaining bits of the count value of the master counter; and a counter setting unit, responsive to a control signal, for setting the master counter at a predetermined count value and for setting each of the plurality of local counters at a value of the plurality of bits of the predetermined count value. The counter device can thus set an arbitrary count value to the master counter and the plurality of local counters.

Preferably, the plurality of bits of the count value of the master counter are a plurality of lower-order bits of the count value of the master counter.

In accordance with a preferred embodiment of the present invention, the counter setting unit includes a bus used for supplying the value of the plurality of bits of the predetermined count value to each of the plurality of local counters so as to allow each of the plurality of local counters to set itself at the value of the plurality of bits of the predetermined count value in response to the control signal.

In accordance with another preferred embodiment of the present invention, the counter setting unit causes each of the plurality of local counters to reset itself in response to the control signal, and, after that, causes the master counter to start counting from the predetermined count value when each of the plurality of local counters reaches the value of the plurality of bits of the predetermined count value. Preferably, the counter setting unit includes a counter that resets itself in response to the control signal, the counter holding a count value equal to the count value of each of the plurality of local counters, and a unit for allowing the master counter to start counting from the predetermined count value when the counter of the counter setting unit reaches the value of the plurality of bits of the predetermined count value. The counter device can thus set an arbitrary count value to the plurality of local counters without having to provide another bus intended for setting the count value of each of the plurality of local counters.

The input signal can be a clock. As an alternative, the input signal is a counter control signal supplied from outside the counter device or generated by another functional block built in one chip including the counter device, the counter control signal being generated based on a sequence of events.

Further objects and advantages of the present invention will be apparent from the following description of the preferred embodiments of the invention as illustrated in the accompanying drawings.

DETAILED DESCRIPTION OF THE PREFERRED EMBODIMENTS

First Embodiment

Figure 1:
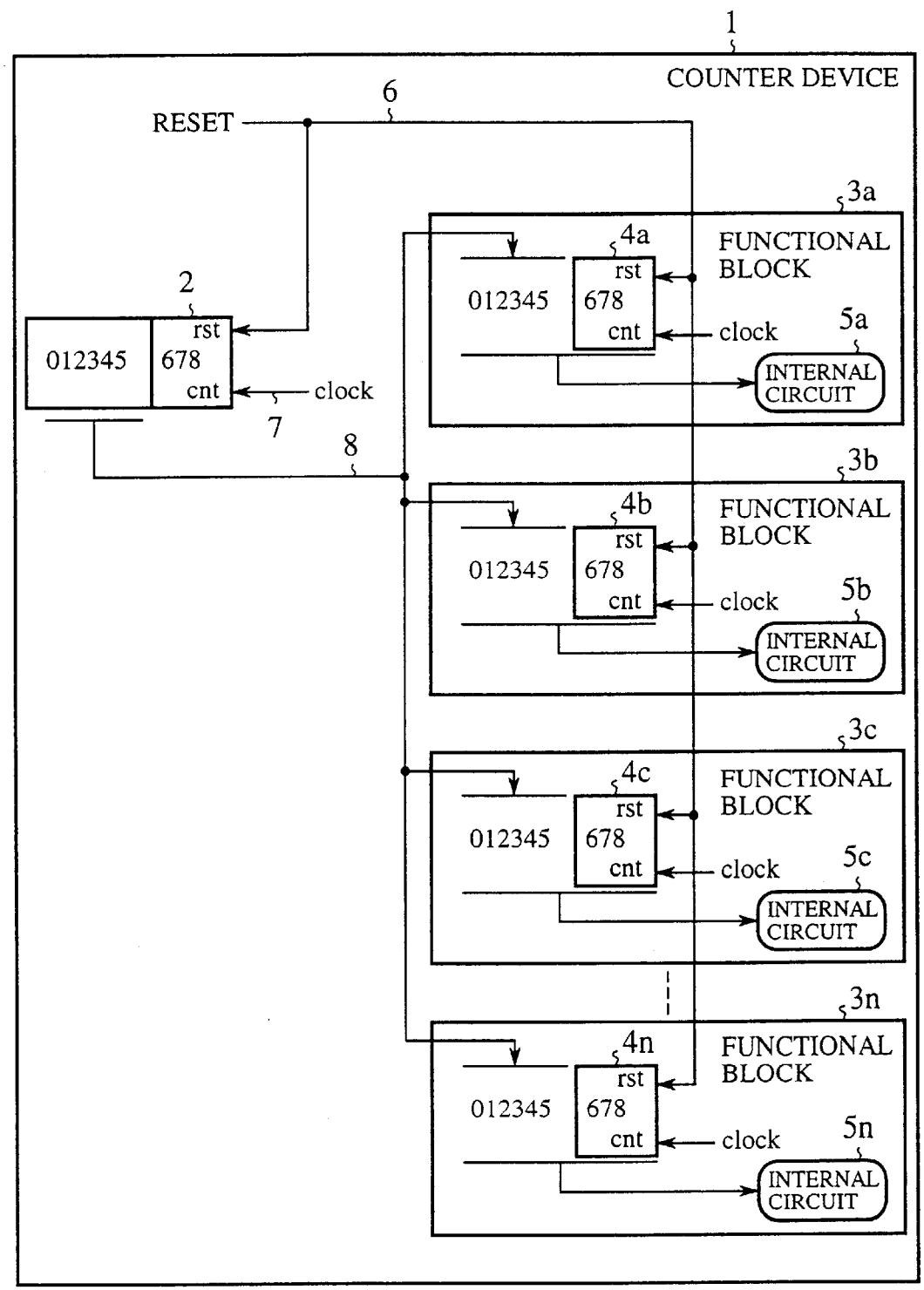
FIG. 1 is a block diagram for showing the hardware structure of a counter device according to a first embodiment of the present invention.

Referring next to FIG. 1, there is illustrated a block diagram showing the hardware structure of a counter device according to a first embodiment of the present invention. In the figure, reference numeral 1 denotes a chip including the counter device according to the first embodiment, 2 denotes a master counter disposed in the chip 1, for holding a multiple-bit data, 3a to 3n denote functional blocks disposed in the chip 1 including the counter device, respectively, and 4a to 4n denote respective local counters disposed in the plurality of functional blocks 3a to 3n, for holding only n lower-order bits of the data held by the master counter 2, which can frequently change. Each of the plurality of local counters 4a to 4n is reset to zero after it counts up to a full count value. Further, 5a to 5n denote internal circuits each of which can refer to the count value of a corresponding one of the plurality of local counters 4a to 4n, respectively, 6 denotes a reset signal line connected to a reset terminal (rst) of the master counter 2 and reset terminals of the plurality of local counters 4a to 4n, 7 denotes a clock supply line connected to a counter terminal (ant) of the master counter 2 and counter terminals of the plurality of local counters 4a to 4n, and 8 denotes a bus used for each of the plurality of local counters 4a to 4n to refer to the remaining N higher-order bits of the count value of the master counter 2.

Each of the master counter 2 and local counters 4a to 4n can be a general counter of any structure with a reset terminal. It is essential only that they can reset their count values when a reset signal applied to their reset terminals is asserted, and, after they are reset, start counting and count up every time a clock signal applied to their counter terminals makes a low to high or high to low transition.

In operation, when referring to the count value of the master counter 2, each of the plurality of internal circuits 5a to 5n, which are disposed in the plurality of functional blocks 3a to 3n, respectively, refers to the N higher-order bits of the count value of the master counter by way of the bus 8 and refers to the n lower-order bits of the count value of the master counter by directly referring to the count value of the local counter disposed in each of the plurality of functional blocks. Each of the plurality of internal circuits 5a to 5n can be so constructed as to refer to the count value of the master counter 2 by directly referring to a data on the bus 8 and a data held by the local counter disposed in each of the plurality of functional blocks. As an alternative, each of the plurality of internal circuits 5a to 5n can refer to the count value of the master counter 2 after latching the data on the bus 8 and the data held by the local counter disposed in each of the plurality of functional blocks. The detailed description of the structure will be omitted hereinafter, because the present invention does not directly relate to the structure.

The counting operation of each of the master counter and local counters can be controlled so that they runs in synchronization with the clock applied thereto. When the reset signal line 6 connected to the master counter 2 and local counters 4a to 4n is asserted, the master counter 2 and local counters 4a to 4n are reset to zero for example. When the resetting process is released, the master counter 2 and local counters 4a to 4n start counting up in synchronization with the clock applied thereto. Since the value of the n lower-order bits of the count value of the master counter 2 is equal to the count value of each of the plurality of local counters 4a to 4n, each of the plurality of functional blocks 3a to 3n refers to the same count value.

As previously mentioned, in accordance with the first embodiment, the counter device enables each of the plurality of functional blocks 3a to 3n to refer to the high-order bits of the count value of the master counter 2, which does not change frequently, by way of the bus 8 and to refer to the lower-order bits of the count value of the master counter 2, which changes frequently, by directly referring to the local counter disposed in each of the plurality of functional blocks. Accordingly, the counter device of the first embodiment can reduce the number of times that the bus 8 for connecting the master counter 2 with the plurality of local counters 4a to 4n changes in voltage or value, thus reducing the power consumption in the bus 8. In addition, since each of the plurality of functional blocks 3a to 3n only has the local counter with a plurality of bits only required for holding the binary value of the lower-order bits of the count value of the master counter 2, thus reducing the amount of hardware. The first embodiment thus offers the advantage of being able to reduce the power consumption in the bus without increasing the amount of hardware.

Second Embodiment

Figure 2:
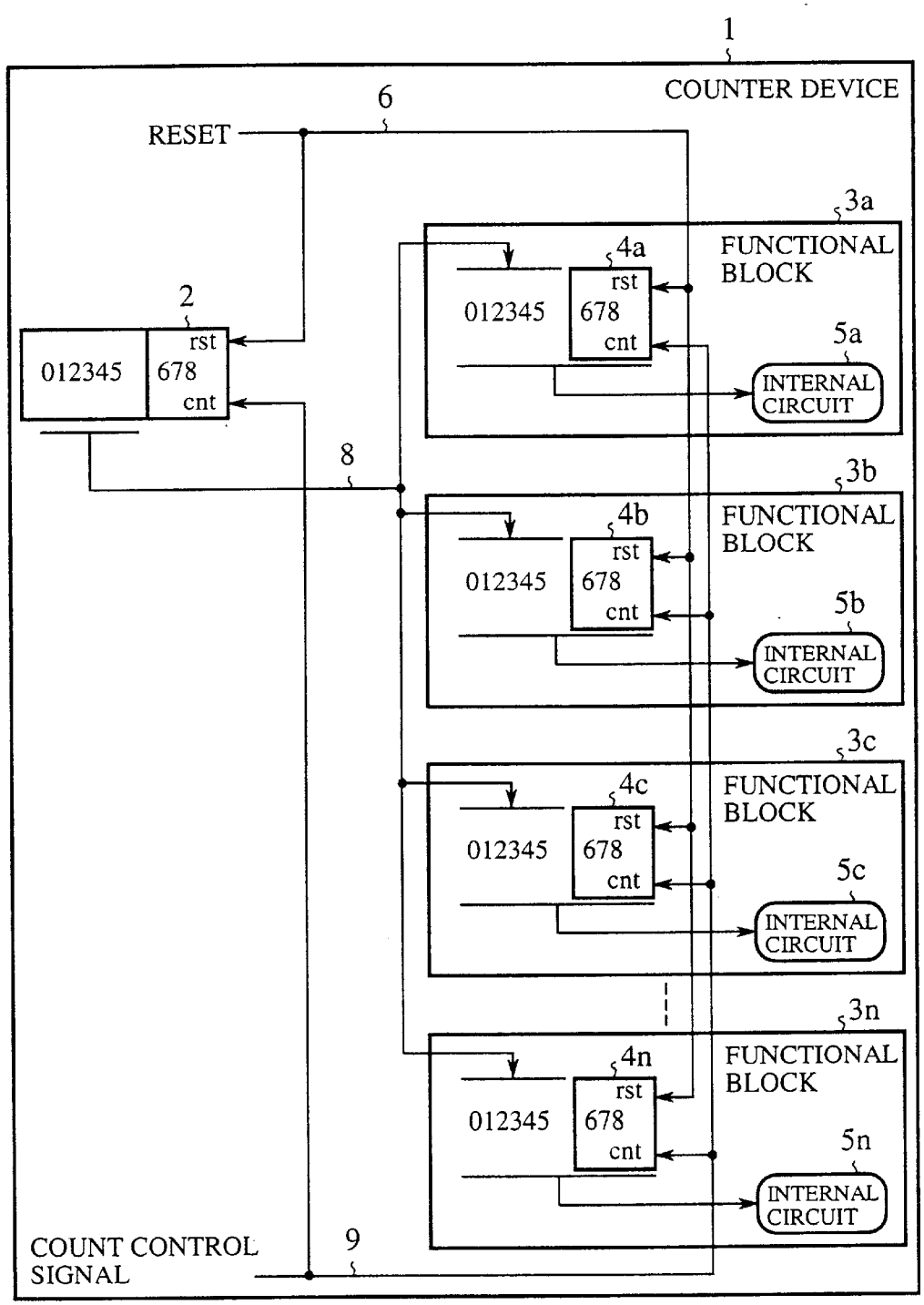
FIG. 2 is a block diagram for showing the hardware structure of a counter device according to a second embodiment of the present invention.

Referring next to FIG. 2, there is illustrated a block diagram showing the structure of a counter device according to a second embodiment. In the figure, the same components as those of the counter device of the aforementioned first embodiment are designated by the same reference numerals as shown in FIG. 1, and therefore the description of the components will be omitted hereinafter. In FIG. 2, reference numeral 9 denotes a counter control signal line connected to a counter terminal of a master counter 2 and counter terminals of a plurality of local counters 4a to 4n.

In operation, the counting operation of each of the master counter 2 and local counters 4a to 4n is controlled so that each of them runs in synchronization with a count control signal applied thereto by way of the count control signal line 9, either from outside the counter device or from another functional block disposed in a chip 1, the count control signal being generated based on a sequence of events. The counter device operates in the same way as the counter device of the aforementioned first embodiment as shown in FIG. 1, with the exception that it counts up in synchronization with the count control signal.

As previously mentioned, in accordance with the second embodiment, the counter device can carry out the counting operation in synchronization with the count control signal which can be generated by an external circuit not shown (i.e., in synchronization with external events). The second embodiment thus offers the same advantage as provided by the first embodiment.

Third Embodiment

Figure 3:
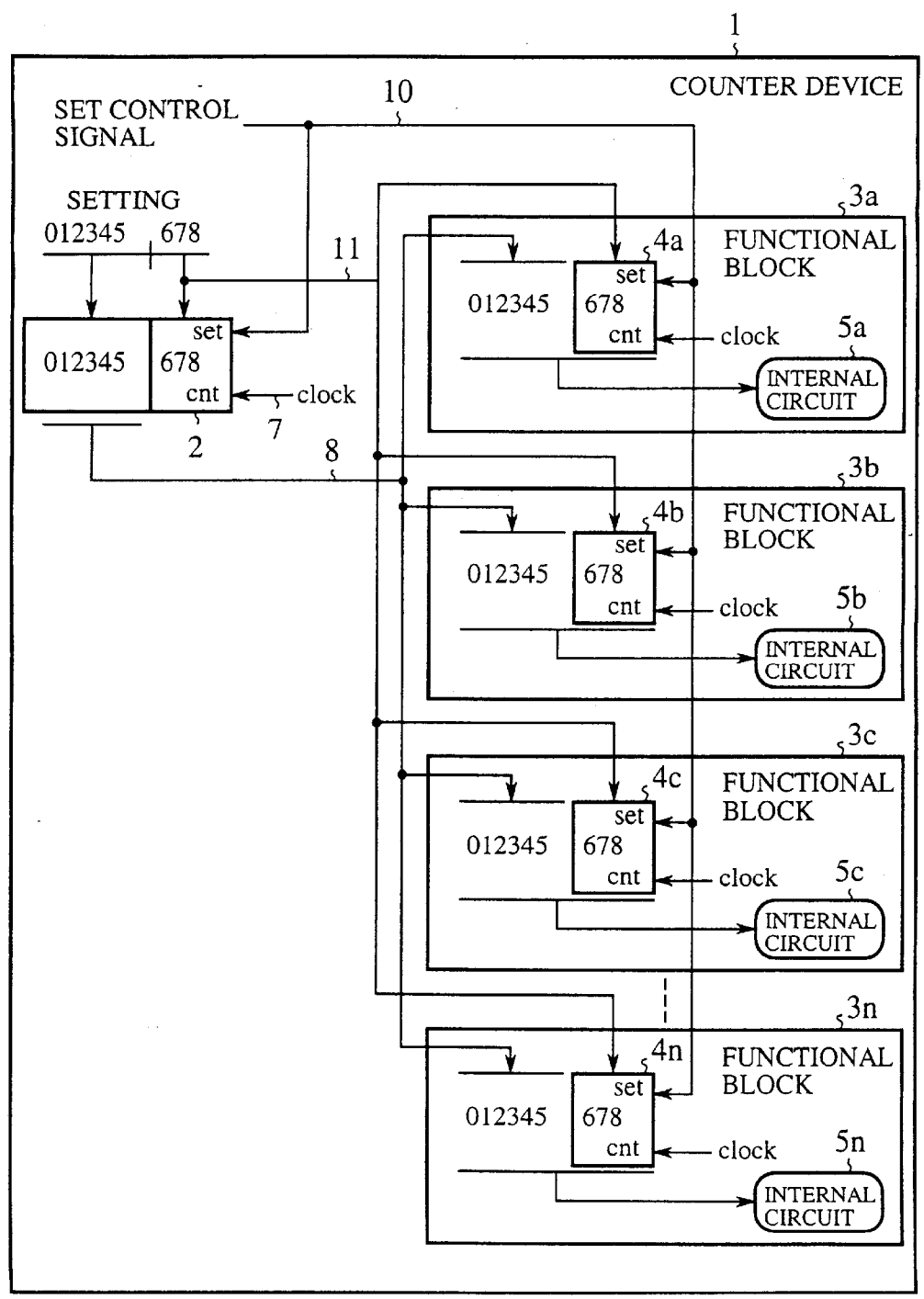
FIG. 3 is a block diagram for showing the hardware structure of a counter device according to a third embodiment of the present invention.

Referring next to FIG. 3, there is illustrated a block diagram showing the hardware structure of a counter device according to a third embodiment. In the figure, the same components as those of the counter device of the aforementioned first embodiment are designated by the same reference numerals as shown in FIG. 1, and therefore the description of the components will be omitted hereinafter. In FIG. 3, reference numeral 10 denotes a counter set control signal line connected to a set terminal (set) of a master counter 2 and set terminals of a plurality of local counters 4a to 4n, and 11 denotes a second bus used for each of the plurality of local counters 4a to 4n to set itself at the value of lower-order bits of a predetermined count value which is set to the master counter 2.

Each of the master counter 2 and local counters 4a to 4n can be a general counter of any structure with a set terminal. It is essential only that they can set itself at a certain count value applied thereto, respectively, when a counter set control signal applied to their set terminals is asserted, and, after the set control signal is negated, start counting and count up every time a clock signal applied to their counter terminals (cnt) makes a low to high or high to low transition.

In operation, when the master counter 2 sets itself at a predetermined setting or count value applied thereto in response to the counter set control signal applied to its set terminal, each of the plurality of local counters 4a to 4n can also set itself at the value of the lower-order bits of the predetermined count value, which is applied thereto by way of the second bus 11. After that, when the counter set control signal is negated, the master counter starts counting the clock signal from the predetermined count value and each of the plurality of local counters 4a to 4n also starts counting the clock signal from the value of the lower-order bits of the predetermined count value.

As previously mentioned, in accordance with the third embodiment, the counter device can set lower-order bits of a predetermined count value to be set to the master counter 2 to the plurality of local counters 4a to 4n in response to the counter set control signal, by way of the second bus 11 for connecting the lower-order bits of the predetermined count value with the plurality of local counters 4a to 4n. The counter device can thus set an arbitrary count value to both the master counter and the plurality of local counters.

Fourth Embodiment

Figure 4:
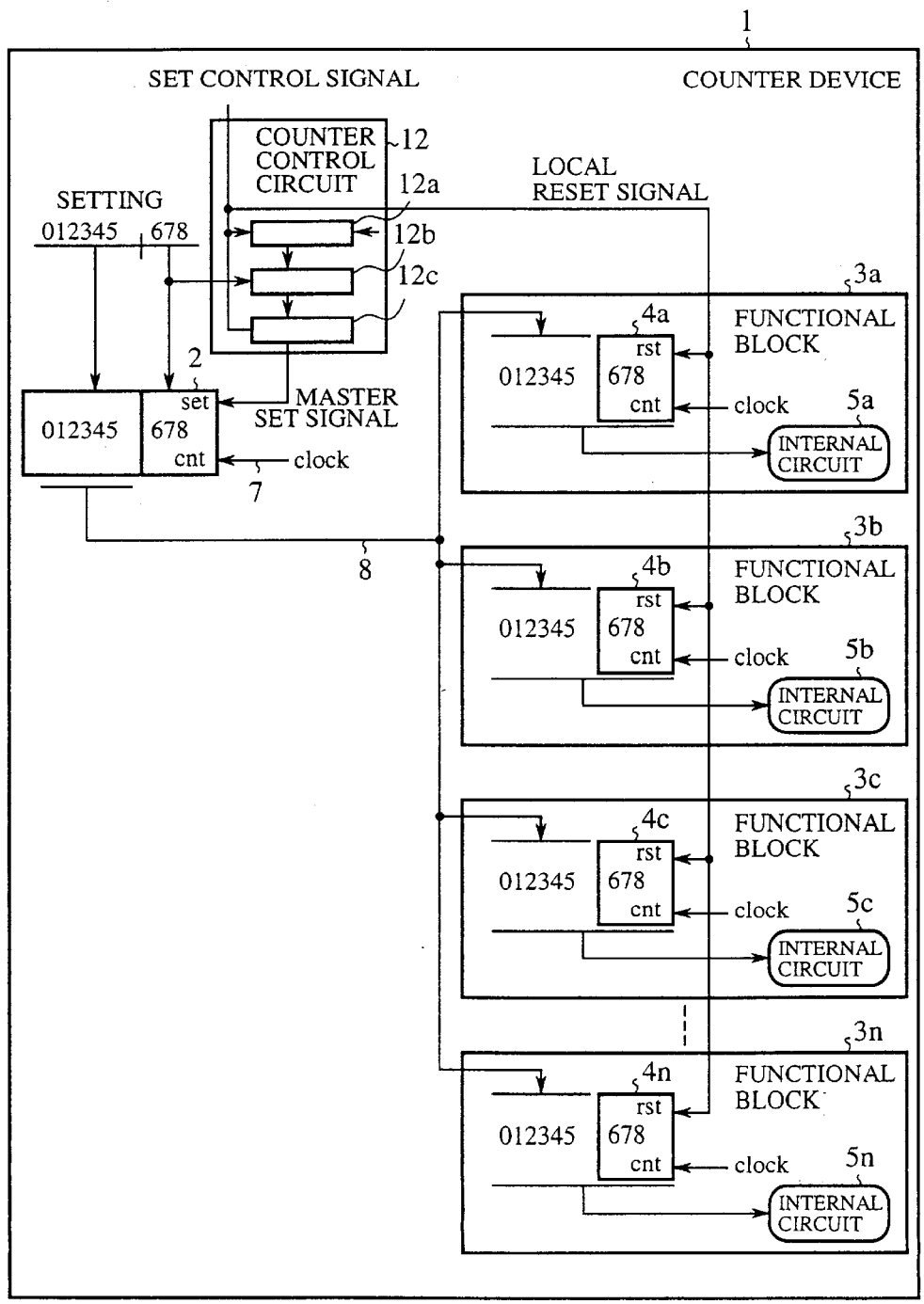
FIG. 4 is a block diagram for showing the hardware structure of a counter device according to a fourth embodiment of the present invention.
Figure 5:
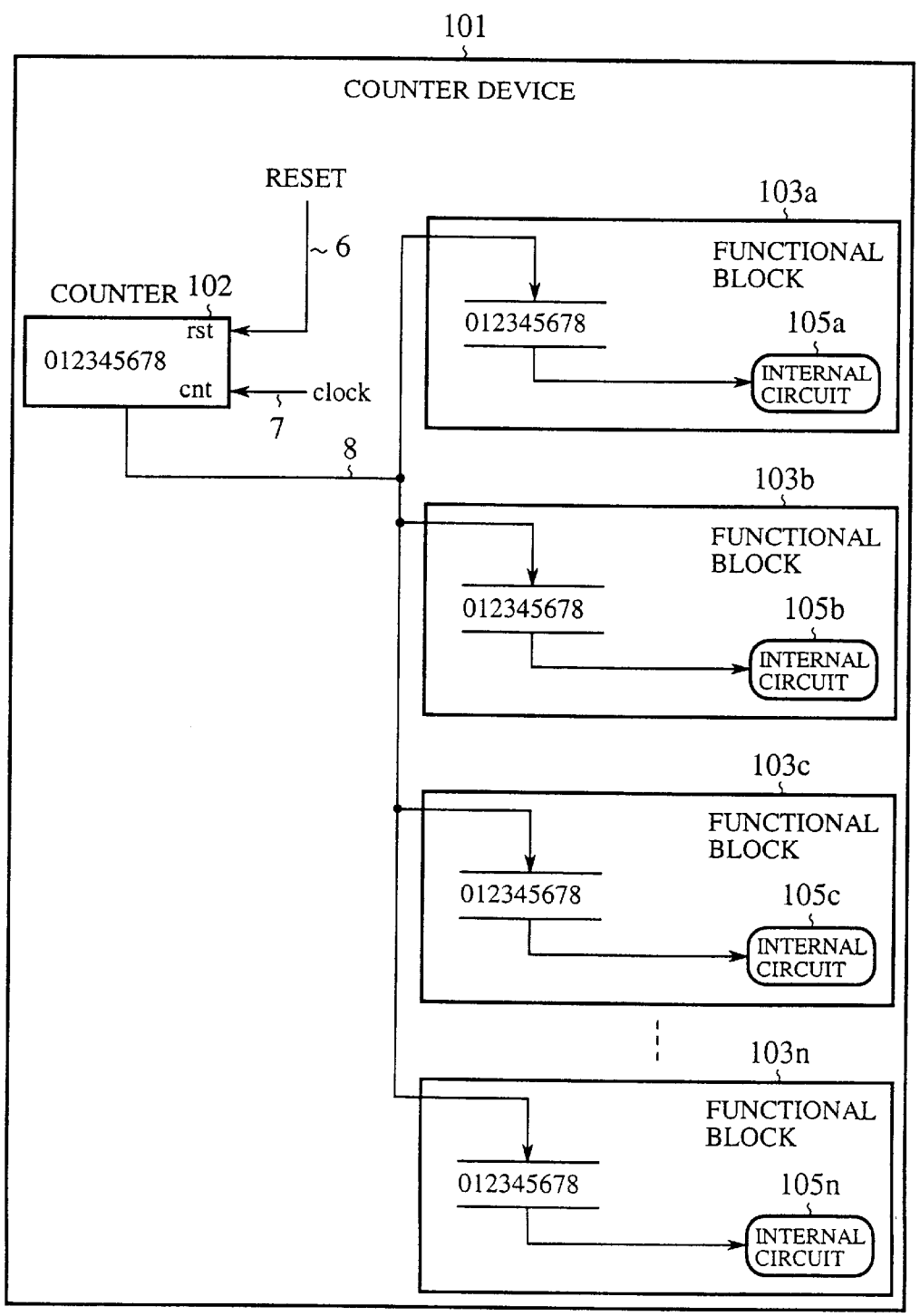
FIG. 5 is a block diagram for showing the hardware structure of a prior art counter device.
Figure 6:
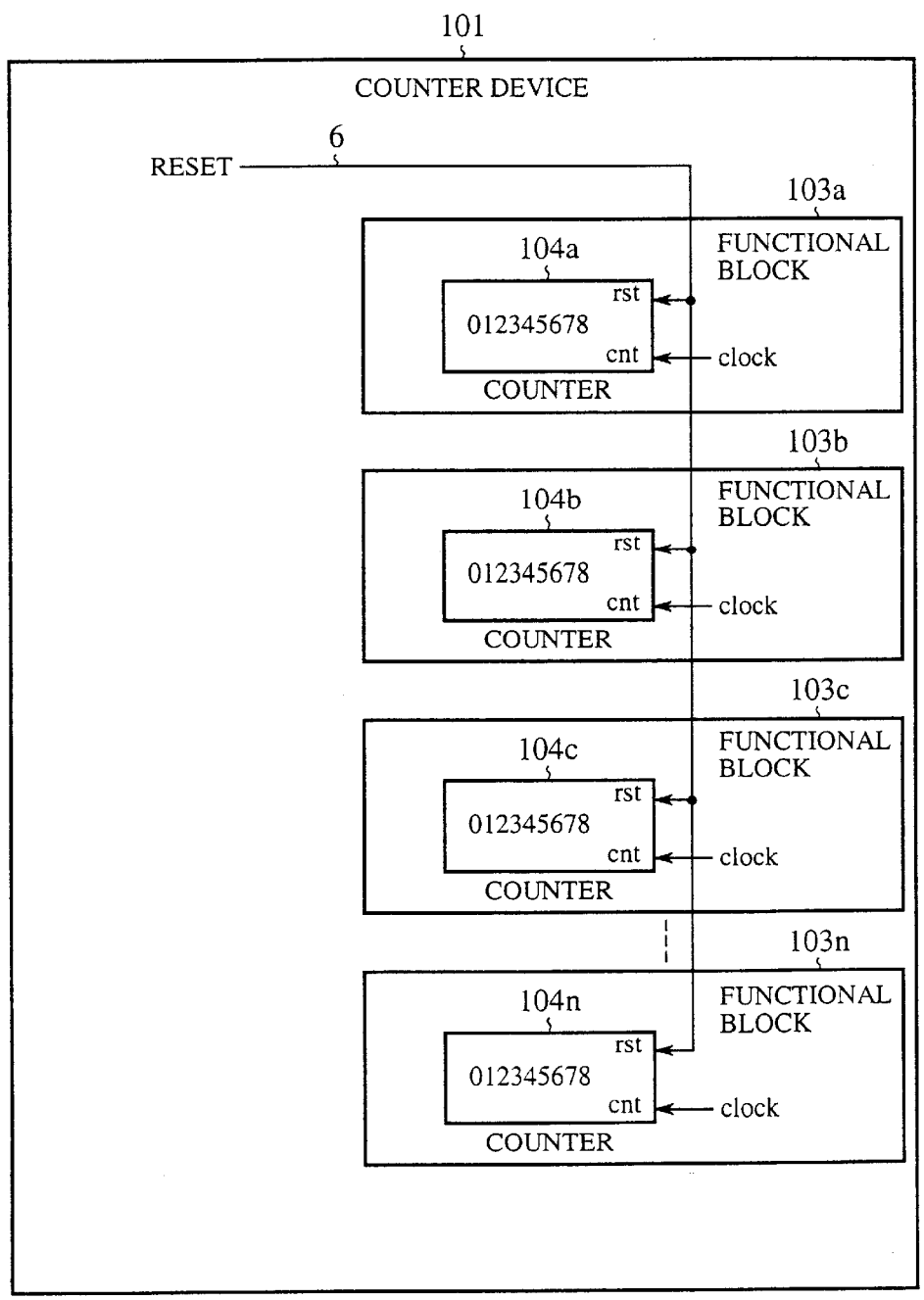
FIG. 6 is a block diagram for showing the hardware structure of another prior art counter device.

Referring next to FIG. 4, there is illustrated a block diagram showing the hardware structure of a counter device according to a fourth embodiment. In the figure, the same components as those of the counter device of the aforementioned third embodiment are designated by the same reference numerals as shown in FIG. 3, and therefore the description of the components will be omitted hereinafter. In FIG. 4, reference numeral 12 denotes a counter control circuit, responsive to a counter set control signal, for furnishing a master set signal line to a set terminal (set) of a master counter 2 and for furnishing a local reset signal to reset terminals (rst) of a plurality of local counters 4a to 4n. The counter control circuit 12 includes a counter 12a for counting clock pulses, a comparator 12b for determining whether the count value of the counter 12a agrees with that of lower-order bits of a predetermined setting or count value set to the master counter 2, and a master set signal generating circuit 12c for generating the master set signal in response to the counter set control signal applied thereto from outside the counter device.

When the count control circuit 12 receives the counter set control signal, the counter 12a starts counting clock pulses applied thereto and the master set signal generating circuit 12c generates and furnishes the master set signal to the set terminal of the master counter 2. When the master counter 2 receives the master set signal asserted, it sets itself at a predetermined setting or count value applied thereto from outside the counter device. While the master set signal is asserted, the master counter does not change its count value, that is, the master counter does not count the clock signal regardless of receipt of the clock signal. On the other hand, when the plurality of local counters 4a to 4n receive a counter set control signal as a local reset signal applied to their reset terminals, they start counting the clock signal simultaneously. The plurality of local counters 4a to 4n have the same count value as the counter 12a in the count control circuit 12.

After that, when the comparator 12b determines that the count value of the counter 12a matches that of the lower-order bits of the predetermined count value which has been set to the master counter 2, it generates and furnishes a match detection signal to the master set signal generating circuit 12c to cause the master set signal generating circuit 12c to stop the supply of the master set signal to the set terminal of the master counter 2. After that, the master counter 2 starts counting the clock signal from the predetermined count value. Thus the value of the lower-order bits of the master counter 2 is always equal to those of the plurality of local counters 4a to 4n.

As previously mentioned, in accordance with the fourth embodiment, the counter device can control the plurality of local counters 4a to 4n independently of the master counter 2 so that the plurality of local counters 4a to 4n reset themselves and start counting in response to the set control signal, and, after that, the master counter 2 starts counting when the count value of each of the plurality of local counters 4a to 4n reaches the value of lower-order bits of a predetermined count value that has been set to the master counter 2 in response to the set control signal. The counter device can thus set an arbitrary value to each of the plurality of local counters 4a to 4n without having to provide another bus intended for setting the count value of each of the plurality of local counters 4a to 4n.

Many widely different embodiments of the present invention may be constructed without departing from the spirit and scope of the present invention. It should be understood that the present invention is not limited to the specific embodiments described in the specification, except as defined in the appended claims.

What is claimed is:

1. A counter device comprising:
   a master counter for counting an input signal applied thereto;
   a plurality of local counters disposed in a plurality of functional blocks, respectively, each for counting the input signal applied thereto, and for holding a count value corresponding to a plurality of bits of a count value of said master counter; and a bus used for each of said plurality of functional blocks to refer to remaining bits of the count value of said master counter.

2. The counter device according to claim 1, wherein said plurality of bits of the count value of said master counter are a plurality of lower-order bits of the count value of said master counter.

3. The counter device according to claim 1, wherein said input signal is a clock.

4. The counter device according to claim 1, wherein said input signal is a counter control signal supplied from outside said counter device or generated by another functional block built in one chip including said counter device, said counter control signal being generated based on a sequence of events.

5. A counter device comprising:

a master counter for counting an input signal applied thereto;

a plurality of local counters disposed in a plurality of functional blocks, respectively, each for counting the input signal applied thereto, and for holding a count value corresponding to a plurality of bits of a count value of said master counter;

a bus used for each of said plurality of functional blocks to refer to remaining bits of the count value of said master counter; and counter setting means, responsive to a control signal, for setting said master counter at a predetermined count value and for setting each of said plurality of local counters at a value of said plurality of bits of said predetermined count value.

6. The counter device according to claim 5, wherein said plurality of bits of the count value of said master counter are a plurality of lower-order bits of the count value of said master counter.

7. The counter device according to claim 5, wherein said counter setting means includes a bus used for supplying the value of said plurality of bits of said predetermined count value to each of said plurality of local counters so as to allow each of said plurality of local counters to set itself at the value of said plurality of bits of said predetermined count value in response to said control signal.

8. The counter device according to claim 5, wherein said counter setting means causes each of said plurality of local counters to reset itself in response to said control signal, and, after that, causes said master counter to start counting from said predetermined count value when each of said plurality of local counters reaches the value of said plurality of bits of said predetermined count value.

9. The counter device according to claim 8, wherein said counter setting means includes a counter that resets itself in response to said control signal, said counter holding a count value equal to the count value of each of said plurality of local counters, and means for allowing said master counter to start counting from said predetermined count value when said counter of said counter setting means reaches the value of said plurality of bits of said predetermined count value.

10. The counter device according to claim 5, wherein said input signal is a clock.

11. The counter device according to claim 5, wherein said input signal is a counter control signal supplied from outside said counter device or generated by another functional block built in one chip including said counter device, said counter control signal being generated based on a sequence of events.

* * * * *